United States Patent
Tanaka et al.

(10) Patent No.: US 9,093,981 B2
(45) Date of Patent: Jul. 28, 2015

(54) CIRCUIT SUBSTRATE

(71) Applicant: TAIYO YUDEN CO., LTD., Tokyo (JP)

(72) Inventors: Sachiko Tanaka, Kanagawa (JP); Naoyuki Tasaka, Kanagawa (JP); Gohki Nishimura, Kanagawa (JP)

(73) Assignee: TAIYO YUDEN CO., LTD., Tokyo (JP)

( * ) Notice: Subject to any disclaimer, the term of this patent is extended or adjusted under 35 U.S.C. 154(b) by 0 days.

(21) Appl. No.: 13/662,990

(22) Filed: Oct. 29, 2012

(65) Prior Publication Data

US 2013/0163212 A1   Jun. 27, 2013

(30) Foreign Application Priority Data

Dec. 22, 2011  (JP) ................. 2011-282013

(51) Int. Cl.
| | |
|---|---|
| H05K 1/18 | (2006.01) |
| H03H 9/70 | (2006.01) |
| H03H 9/05 | (2006.01) |
| H03H 9/72 | (2006.01) |

(52) U.S. Cl.
CPC ............. *H03H 9/706* (2013.01); *H03H 9/0566* (2013.01); *H03H 9/725* (2013.01); *H01L 2224/16225* (2013.01); *H01L 2224/19* (2013.01); *H03H 9/0561* (2013.01)
USPC ............................ 361/761; 361/748; 361/760

(58) Field of Classification Search
USPC .......................................... 361/761, 748, 760
See application file for complete search history.

(56) References Cited

U.S. PATENT DOCUMENTS

| | | | |
|---|---|---|---|
| 7,795,727 B2 | 9/2010 | Bauer et al. | |
| 7,961,478 B2* | 6/2011 | Cousin | 361/760 |
| 2003/0128083 A1* | 7/2003 | Matsuta | 333/193 |
| 2003/0169575 A1* | 9/2003 | Ikuta et al. | 361/761 |
| 2005/0104685 A1 | 5/2005 | Kuroki et al. | |
| 2005/0146854 A1 | 7/2005 | Ikuta et al. | |
| 2011/0076800 A1* | 3/2011 | Hirai et al. | 438/107 |
| 2011/0254639 A1 | 10/2011 | Tsutsumi et al. | |

FOREIGN PATENT DOCUMENTS

| | | |
|---|---|---|
| CN | 1431776 A | 7/2003 |
| CN | 1441613 A | 9/2003 |
| CN | 1606234 A | 4/2005 |
| EP | 1094538 A2 | 4/2001 |

(Continued)

OTHER PUBLICATIONS

Japanese Office Action dated Dec. 11, 2012, in a counterpart Japanese patent application No. 2011-282013.
U.S. Appl. No. 13/662,982, filed Oct. 29, 2012.
Japanese Office Action dated Dec. 11, 2012, in a counterpart Japanese patent application No. 2011-282012 of the related U.S. Appl. No. 13/662,982.

(Continued)

*Primary Examiner* — Timothy Thompson
*Assistant Examiner* — Andargie M Aychillhum
(74) *Attorney, Agent, or Firm* — Chen Yoshimura LLP (57) ABSTRACT

A circuit substrate includes: a laminate substrate in which a conductive layer and an insulating layer are laminated; a filter chip that has an acoustic wave filter and is provided inside of the laminate substrate; and an active component that is provided on a surface of the laminate substrate and is connected with the filter chip, at least a part of the active component overlapping with a projected region that is a region of the filter chip projected in a thickness direction of the laminate substrate.

7 Claims, 6 Drawing Sheets

(56) References Cited

FOREIGN PATENT DOCUMENTS

| JP | 2001-189605 A | 7/2001 |
| JP | 2001-313467 A | 11/2001 |
| JP | 2002-359327 A | 12/2002 |
| JP | 2007-273585 A | 10/2007 |
| JP | 2011-176061 A | 9/2011 |
| KR | 10-2011-0091878 A | 8/2011 |

OTHER PUBLICATIONS

Korean Office Action dated Oct. 31, 2013, in a counterpart Korean patent application No. 10-2012-150445.
European Search Report dated Apr. 16, 2014, in a counterpart European patent application No. 12190574.9.
European Search Report dated Apr. 16, 2014, in a counterpart European patent application No. 12190575.6.
Chinese Office Action dated Feb. 17, 2015, in a counterpart Chinese patent application No. 201210536741.2.

* cited by examiner

CIRCUIT SUBSTRATE

CROSS-REFERENCE TO RELATED APPLICATION

This application is based upon and claims the benefit of priority of the prior Japanese Patent Application No. 2011-282013, filed on Dec. 22, 2011, the entire contents of which are incorporated herein by reference.

FIELD

A certain aspect of the present invention relates to a circuit substrate.

BACKGROUND

There is known an acoustic wave filter such as a SAW (Surface Acoustic Wave) filter or a FBAR (Film Bulk Acoustic Resonator) filter, as a filter being superior in high frequency characteristic. Downsizing of a component including an acoustic wave filter is needed as a mobile communication terminal such as a mobile phone is spread. In order to downsize a component, a circuit substrate in which an acoustic wave filter and an electronic component such as a power amplifier or an IC (Integrated Circuit) are provided on an identical substrate is used. Japanese Patent Application Publication No. 2001-189605 discloses that a SAW filter chip is provided on an upper face of a substrate and a filter is structured with an inner interconnection line in the substrate. Japanese Patent Application Publication No. 2011-176061 discloses that a transistor and a SAW filter are provided on an upper face of a substrate.

SUMMARY OF THE INVENTION

According to an aspect of the present invention, there is provided a circuit substrate including: a laminate substrate in which a conductive layer and an insulating layer are laminated; a filter chip that has an acoustic wave filter and is provided inside of the laminate substrate; and an active component that is provided on a surface of the laminate substrate and is connected with the filter chip, at least a part of the active component overlapping with a projected region that is a region of the filter chip projected in a thickness direction of the laminate substrate.

DETAILED DESCRIPTION

With conventional technology, an interconnection line connecting an acoustic wave filter and an electronic component is long. This results in increasing of noise influence. As a result, there was a case where high frequency characteristic of an acoustic wave filter was degraded. And it is difficult to sufficiently downsize a circuit substrate.

Figure 1A:
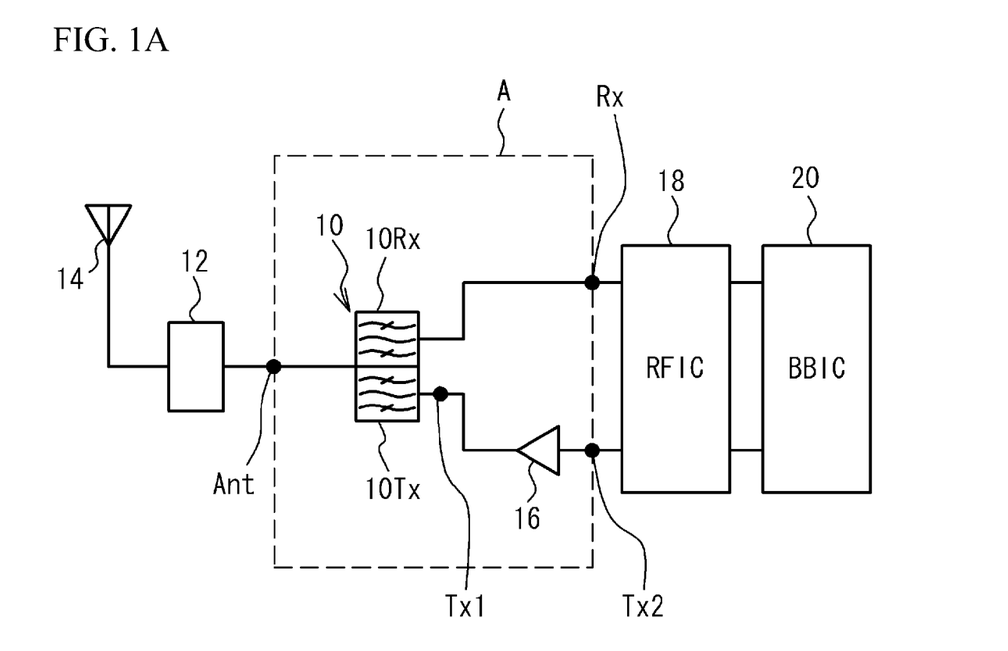
FIG. 1A illustrates a schematic view of a module including an acoustic wave filter.

First, a description will be given of a module including an acoustic wave filter. FIG. 1A illustrates a schematic view of the module including an acoustic wave filter.

As illustrated in FIG. 1A, a duplexer 10 includes a transmit filter 10Tx and a receive filter 10Rx that are SAW filters or the like. The transmit filter 10Tx is connected between an antenna node Ant (common node) and a transmit node Tx1. The receive filter 10Rx is connected between the antenna node Ant and a receive node Rx. The transmit filter 10Tx and the receive filter 10Rx are connected with a ground terminal (not illustrated). A receive node Rx is connected between the receive filter 10Rx and an RFIC (Radio Frequency Integrated Circuit) 18 (electronic component). A transmit node Tx2 is connected between a PA 16 and the RFIC 18.

A BBIC (Base Band Integrated Circuit) 20 inputs a transmit signal of a base band into the RFIC 18. The RFIC 18 up-converts the transmit signal of the base band into a transmit signal of high frequency. The transmit signal is amplified by the PA (Power Amplifier) 16 and is input into the transmit filter 10Tx. The transmit filter 10Tx allows passage of a signal having a frequency in a pass band of the transmit filter 10Tx included in the transmit signal, and suppresses a signal having a frequency out of the pass band of the transmit filter 10Tx included in the transmit signal. A switch 12 is connected with other systems having the duplexer 10, the PA 16, the RFIC 18 and the BBIC 20 (not illustrated in FIG. 1A). For example, the switch 12 selects one of the systems according to a pass band and makes an antenna 14 input a signal or output a signal. The transmit signal is input into the antenna 14 via the switch 12 and is transmitted from the antenna 14. A receive signal received by the antenna 14 is input into the receive filter 10Rx via the switch 12. The receive filter 10Rx allows passage of a signal having a frequency in a pass band of the receive filter 10Rx included in the receive signal and suppresses a signal having a frequency out of the pass band of the receive filter 10Rx included in the receive signal. The receive signal is input into the RFIC 18 and is amplified by a low noise amplifier included in the RFIC 18. The RFIC 18 down-converts the receive signal into a receive signal of the base band. The BBIC 20 processes the receive signal of the base band. In order to achieve preferable high frequency characteristic, impedance matching between the duplexer 10, the PA 16, the switch 12, the antenna 14, the RFIC 18 and the BBIC 20 is needed.

Figure 1B:
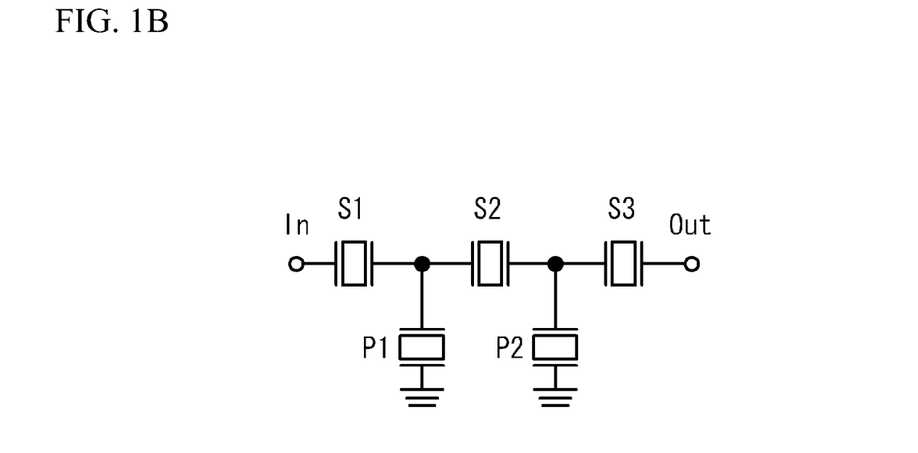
FIG. 1B illustrates a circuit diagram of a ladder type filter.

A ladder type filter or the like is used as the transmit filter 10Tx and the receive filter 10Rx. FIG. 1B illustrates a circuit diagram of a ladder type filter. Series resonators S1 through S3 are connected in series between an input terminal "In" and an output terminal "Out". A parallel resonator P1 is connected between the series resonators S1 and S2. A parallel resonator P2 is connected between the series resonators S2 and S3. The parallel resonators P1 and P2 are connected with a ground terminal. The input terminal "In" of the transmit filter 10Tx is connected with the transmit node Tx1 of FIG. 1A. The output terminal "Out" of the transmit filter 10Tx is connected with the antenna node Ant. The input terminal "In" of the receive filter 10Rx is connected with the antenna node Ant. The output terminal "Out" of the receive filter 10Rx is connected with the receive node Rx. A multiple mode filter or the like other than the ladder type filter may be used as the transmit filter 10Tx and the receive filter 10Rx.

Figure 2A:
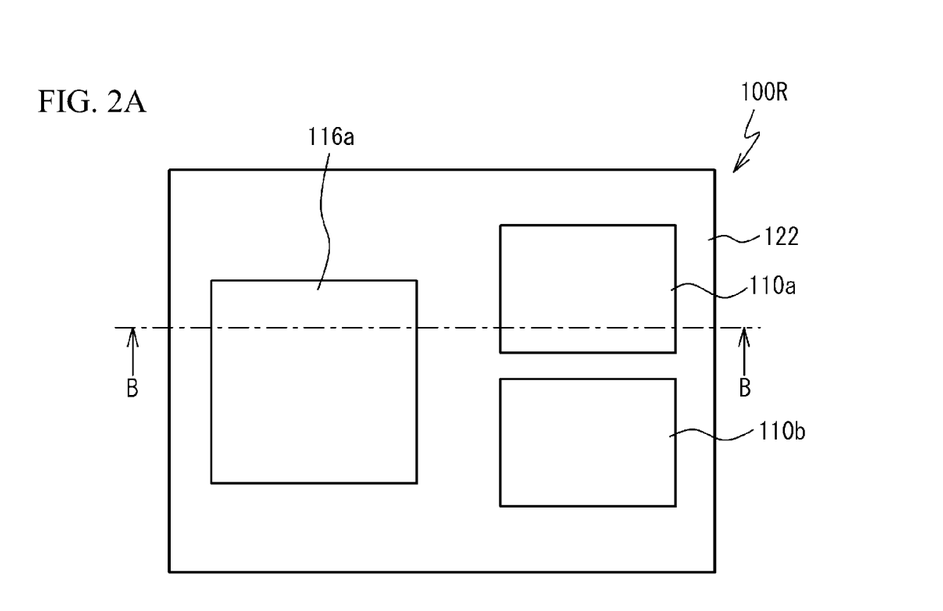
FIG. 2A illustrates a top view of a circuit substrate in accordance with a comparative example.
Figure 2B:
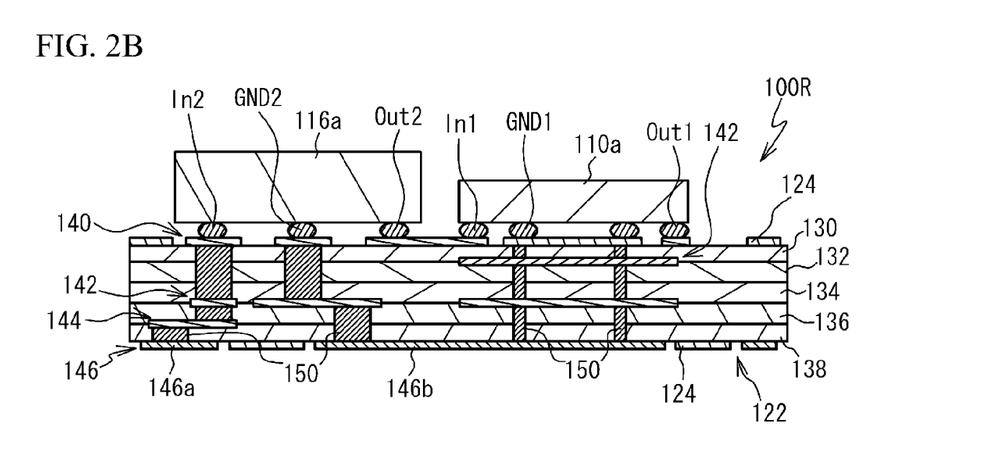
FIG. 2B illustrates a cross sectional view taken along a line B-B of FIG. 2A.

A description will be given of an example as a comparative example in which a structure surrounded by a square A in the module is provided on a single circuit substrate. FIG. 2A illustrates a top view of a circuit substrate 100R in accordance with the comparative example. FIG. 2B illustrates a cross sectional view taken along a line B-B of FIG. 2A. In FIG. 2A, a solder resist 124 and a conductive layer 140 are not illustrated. In FIG. 2B, a numeral is added to only a part of a plurality of via interconnection lines 150.

As illustrated in FIG. 2A and FIG. 2B, insulating layers 130, 132, 134, 136 and 138, the conductive layer 140 and conductive layers 142, 144 and 146 are laminated. Each of adjacent conductive layers is connected by the via interconnection line 150 penetrating the insulating layers 130, 132, 134, 136 and 138. The conductive layer 146 acts as a foot pad for connecting a laminate substrate 122 and an external component such as the antenna 14, the RFIC 18 or the BBIC 20. A transmit terminal 146a of the conductive layer 146 illustrated in FIG. 2B corresponds to the transmit node Tx2 of FIG. 1A. A receive terminal corresponding to the receive node Rx of FIG. 1A and an antenna terminal corresponding to the antenna node Ant are not illustrated.

A transmit filter chip 110a is a SAW filter chip or the like including the transmit filter 10Tx of FIG. 1A. A receive filter chip 110b is a SAW filter chip or the like including the receive filter 10Rx. An active component 116a includes the PA 16 of FIG. 1A.

The transmit filter chip 110a and the receive filter chip 110b are flip-chip mounted on the conductive layer 140 provided on an upper face of the laminate substrate 122. A ground terminal GND1 of the transmit filter chip 110a and a ground terminal GND2 of the active component 116a are connected with a ground terminal 146b in common. An output terminal Out1 of the transmit filter chip 110a is connected with the antenna terminal included in the conductive layer 146. The antenna terminal is connected with the switch 12 of FIG. 1A. An input terminal In1 of the transmit filter chip 110a is connected with an output terminal Out2 of the active component 116a via an interconnection line included in the conductive layer 140. An input terminal In2 of the active component 116a is connected with the transmit terminal 146a. The transmit terminal 146a is connected with the RFIC 18 of FIG. 1A.

The filter chips (the transmit filter chip 110a and the receive filter chip 110b) and the active component 116a are provided on the upper face of the laminate substrate 122. Therefore, the laminate substrate 122 gets larger. The interconnection line extending along a face direction of the laminate substrate 122 gets longer as well as the interconnection line included in the conductive layer 140, and has a length of 150 μm or more, for example. Therefore, a high frequency signal passing through the interconnection line tends to be subjected to influence of an electrical noise. Thus, the high frequency characteristic of the circuit substrate 100R may be degraded. Locations of the filter chips and the active component 116a and pathways of the interconnection lines may be limited. Therefore, the interconnection lines get longer, and the high frequency characteristic may be greatly degraded. Next, a description will be given of a first embodiment.

First Embodiment

Figure 3A:
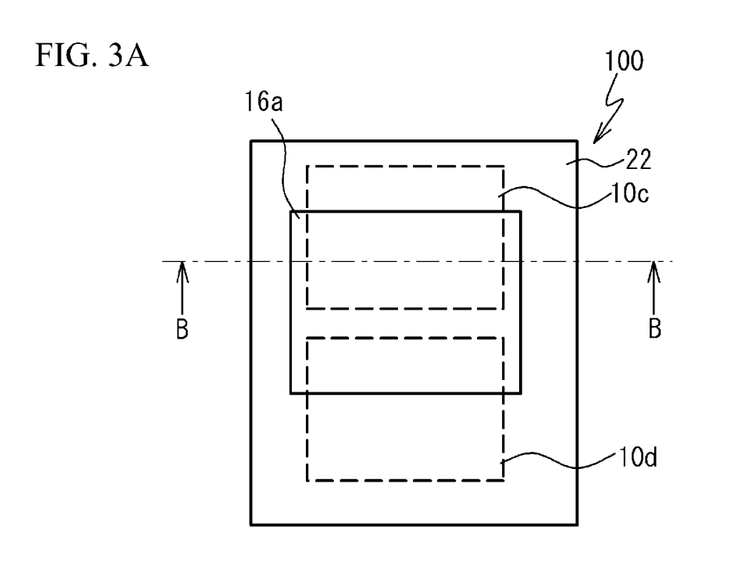
FIG. 3A illustrates a top view of a circuit substrate in accordance with a first embodiment.
Figure 3B:
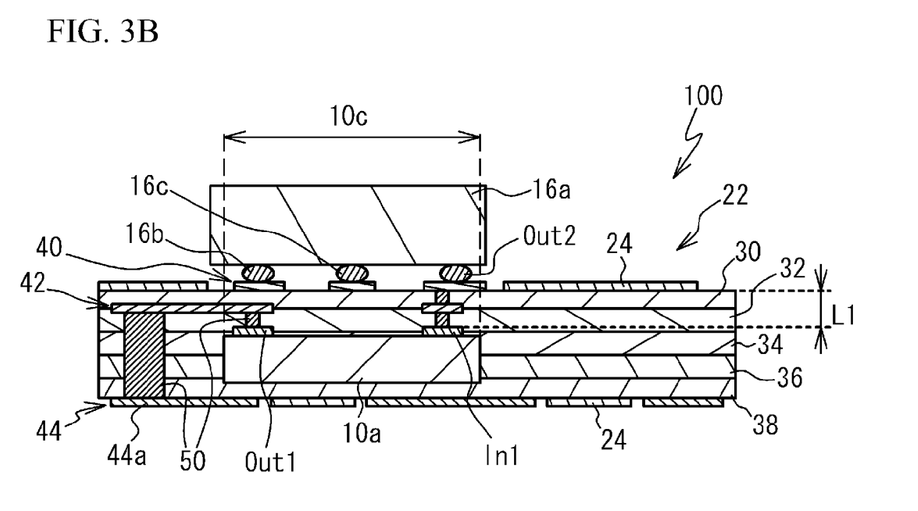
FIG. 3B illustrates a cross sectional view taken along a line B-B of FIG. 3A.

A first embodiment is an embodiment in which filter chips (a transmit filter chip and a receive filter chip) are provided inside of a laminate substrate, and an active component is mounted on an upper face (surface) of the laminate substrate. FIG. 3A illustrates a top view of a circuit substrate 100 in accordance with the first embodiment. FIG. 3B illustrates a cross sectional view taken along a line B-B of FIG. 3A.

As illustrated in FIG. 3A and FIG. 3B, a transmit filter chip 10a and a receive filter chip 10b are SAW filter chips in which an IDT (Interdigital Transducer) is formed on a piezoelectric substrate made of a piezoelectric material such as lithium tantalate ($LiTaO_3$) or lithium niobate ($LiNbO_3$), and are provided inside of a laminate substrate 22. An IDT exciting an acoustic wave is not illustrated, but is provided on the upper face of each filter chip.

An active component 16a is flip-chip mounted on the upper face of the laminate substrate 22. The active component 16a overlaps with a projected region 10c (with reference to a broken line) that is a region of the transmit filter chip 10a projected in a thickness direction of the laminate substrate 22 (up and down direction of FIG. 3B) and a projected region 10d (with reference to a broken line) that is a region of a receive filter chip (not illustrated) projected in the thickness direction of the laminate substrate 22. Therefore, an area of the laminate substrate 22 is smaller than the comparative example. It is therefore possible to downsize the circuit substrate 100.

As illustrated in FIG. 3B, an input terminal In1 of the transmit filter chip 10a is connected with an output terminal Out2 of the active component 16a via an interconnection line 50 and conductive layers 40 and 42. The via interconnection line 50 and the conductive layers 40 and 42 between the input terminal In1 and the output terminal Out2 correspond to an interconnection line on which the transmit node Tx1 of FIG. 1A is provided. The output terminal Out1 of the transmit filter chip 10a is connected with an antenna terminal 44a included in a conductive layer 44 via the via interconnection line 50 and the conductive layer 42. The antenna terminal 44a corresponds to the antenna node Ant of FIG. 1A and is connected with the switch 12 and the antenna 14. Terminals 16b and 16c of the active component 16a correspond to two of a terminal connected with a power supply, a ground terminal and an input terminal.

The active component 16a connected with the transmit filter chip 10a overlaps with the projected region 10c. Therefore, the interconnection line connecting the transmit filter chip 10a and the active component 16a does not include an interconnection line extending in the face direction, and is structured with the via interconnection line 50. A thickness of insulating layers 30 and 32 is, for example, 30 μm or the like. A total length L1 of two interconnection lines connecting the transmit filter chip 10a and the active component 16a is, for example, 60 μm or the like. The interconnection line connecting the transmit filter chip 10a and the active component 16a in the first embodiment is shorter than the comparative example. Thus, the influence of noise can be reduced. Further, a parasitic component such as a parasitic capacitance or a parasitic inductance of the interconnection lines is reduced. Therefore, the high frequency characteristic of the circuit substrate 100 is improved. In order to improve the high frequency characteristic effectively, it is preferable that the transmit filter chip 10a is directly connected with the active component 16a not through another chip component such as an inductor.

The filter chip is provided inside of the laminate substrate 22. Therefore, the freedom degree of the locations of the active component 16a and the pathways of the interconnection lines gets larger. Thus, the circuit substrate 100 can be downsized, and the interconnection line extending along the face direction can be shortened.

The number of the insulating layers and the number of the conductive layers included in the laminate substrate 22 may be changed. The circuit substrate 100 may have at least one of or all of the switch 12, the antenna 14, the BBIC 20 and the RFIC 18 other than circuit elements surrounded by the square A of FIG. 1A. The active component 16a may include the switch 12, the RFIC 18 and the BBIC 20 of FIG. 1A. When the active component 16a is an component connected with the receive filter chip as in the case of the switch 12 and the RFIC 18, it is preferable that the active component 16a is inside of the projected region 10d and is connected with the receive filter chip via the via interconnection line 50. The active component 16a may be a component into which an electrical power is input, other than the case of FIG. 1A.

The insulating layers 30 and 32 and insulating layers 34, 36 and 38 are made of a resin such as glass epoxy resin or a ceramics. When the insulating layers are made of resin, the housing of the filter chip gets easier. Each terminal of the transmit filter chip 10a and the conductive layers 40, 42 and 44 are made of a metal such as copper (Cu) or aluminum (Al) or an alloy including the metal. A solder resist 24 of FIG. 3B restrains adhesion of a solder ball used for the flip-chip mounting to an undesirable position of the laminate substrate 22 and the conductive layer 40.

Second Embodiment

Figure 4A:
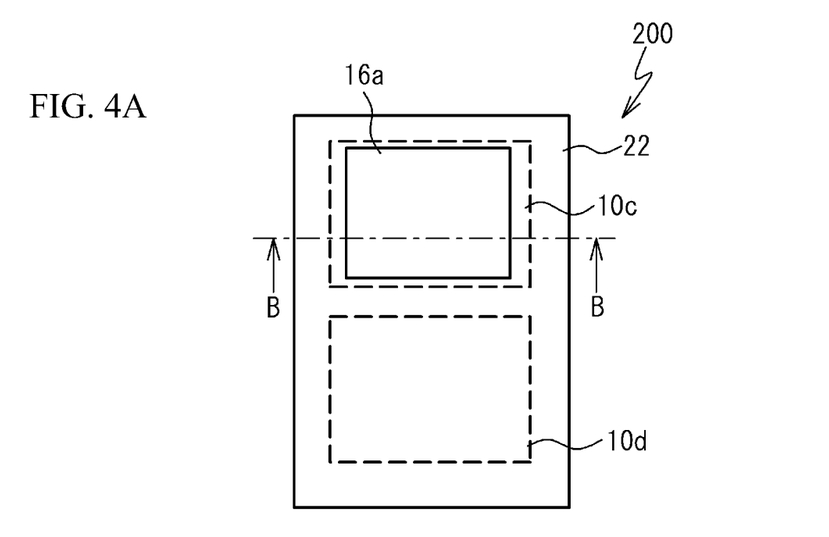
FIG. 4A illustrates a top view of a circuit substrate in accordance with a second embodiment.
Figure 4B:
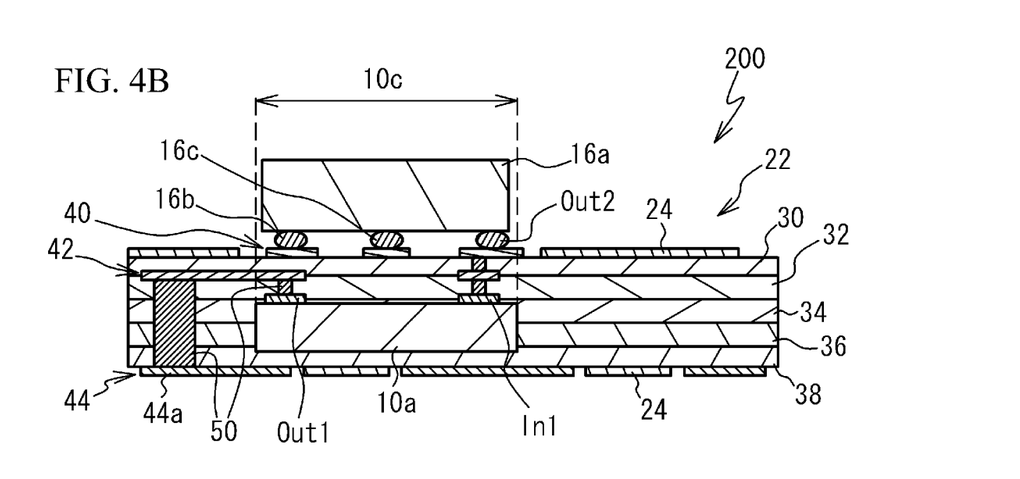
FIG. 4B illustrates a cross sectional view taken along a line B-B of FIG. 4A.

A second embodiment is an embodiment in which whole of the active component 16a is inside of the projected region 10c. FIG. 4A illustrates a top view of a circuit substrate 200 in accordance with the second embodiment. FIG. 4B illustrates a cross sectional view taken along a line B-B of FIG. 4A.

As illustrated in FIG. 4A and FIG. 4B, the whole of the active component 16a is inside of the projected region 10c. It is therefore possible to downsize the circuit substrate 200 more. The interconnection line can be shortened as well as the first embodiment. Therefore, the high frequency characteristic can be improved.

Third Embodiment

Figure 5A:
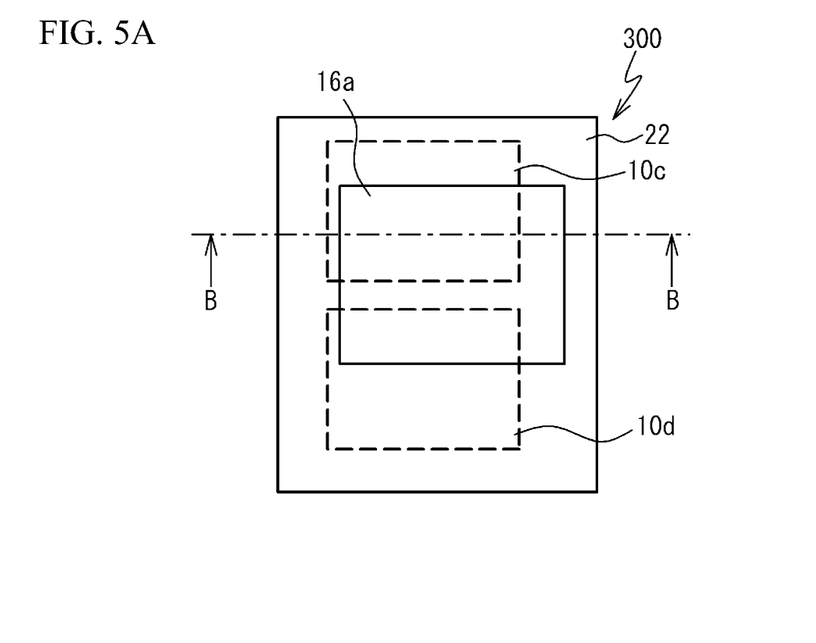
FIG. 5A illustrates a top view of a circuit substrate in accordance with a third embodiment.
Figure 5B:
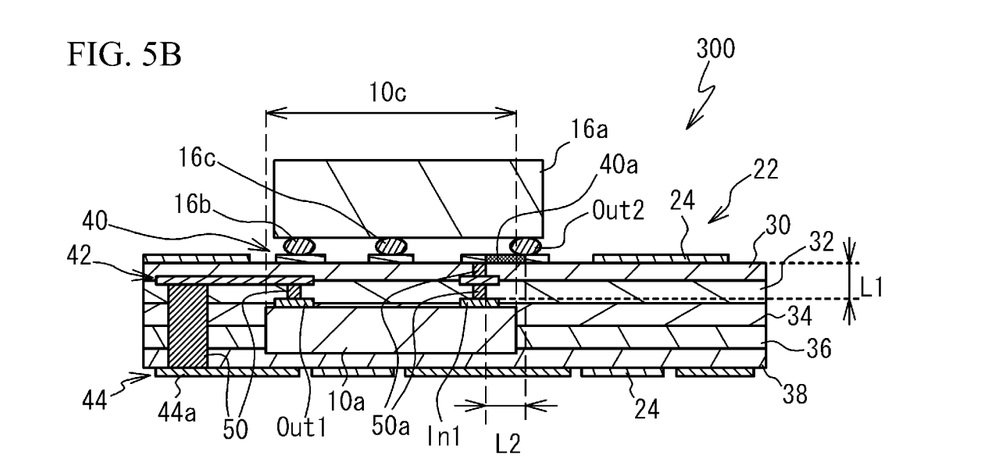
FIG. 5B illustrates a cross sectional view taken along a line-B-B of FIG. 5A.

A third embodiment is an embodiment in which an interconnection line in the face direction is used. FIG. 5A illustrates a top view of a circuit substrate 300 in accordance with a third embodiment. FIG. 5B illustrates a cross sectional view taken along a line-B-B of FIG. 5A.

As illustrated in FIG. 5A and FIG. 5B, the transmit filter chip 10a is connected with the active component 16a via an interconnection line 40a (first interconnection line, with reference to meshed lines of FIG. 5B) included in the conductive layer 40 and a via interconnection line 50a (second interconnection line). A length L2 of the interconnection line 40a is, for example, 30 μm. A total length L1 of the via interconnection line 50a is, for example, 60 μm. Even if the via interconnection line 50a is not provided so as to overlap with the active component 16a, the high frequency characteristic can be improved, because the interconnection line 40a extending in the face direction is shorter than the via interconnection line 50a. The length of the interconnection line 40a can be changed according to the layout on the upper face of the laminate substrate 22. However, it is preferable that the interconnection line 40a is shorter than the via interconnection line 50a. As described in the first embodiment through the third embodiment, at least a part of the active component 16a overlaps with the projected region 10c. The first embodiment through the third embodiment can be used according to the size of the active component 16a.

Fourth Embodiment

Figure 6:
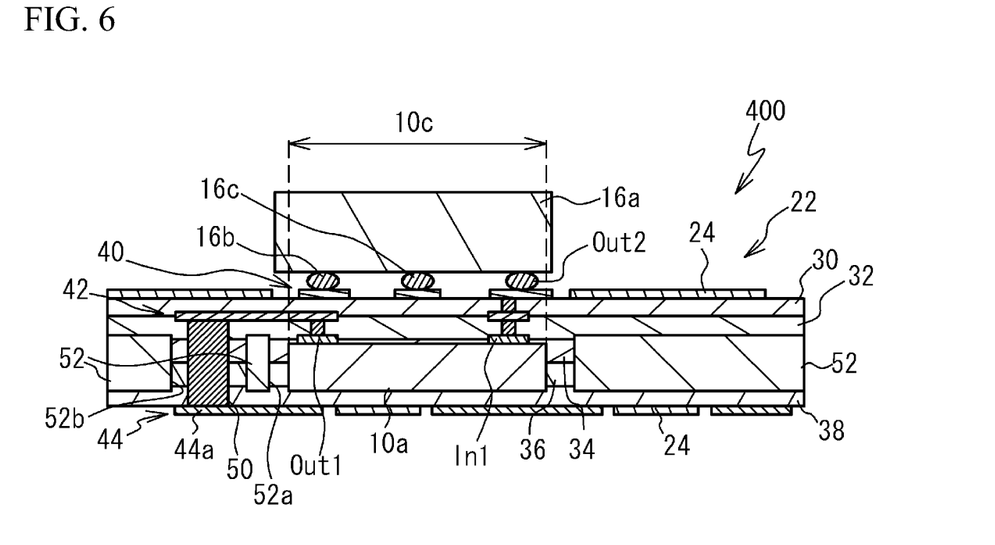
FIG. 6 illustrates a cross sectional view of a circuit substrate in accordance with a fourth embodiment.

A fourth embodiment is an embodiment in which a core is used. FIG. 6 illustrates a cross sectional view of a circuit substrate 400 in accordance with the fourth embodiment.

As illustrated in FIG. 6, the laminate substrate 22 includes a core 52 between the insulating layers 32 to 38. The core 52 has a thickness of 250 μm or the like, is made of a metal such as copper, and has a ground potential. The transmit filter chip 10a is provided inside of an opening 52a of the core 52. The via interconnection line 50 connecting the conductive layer 42 and the conductive layer 44 extends to an opening 52b. The core 52 suppresses signal interference between the conductive layers 40 and 42 on the upper side of the core 52 and the conductive layer 44 on the lower side of the core 52. This results in improvement of the high frequency characteristic. The core 52 is made of a metal and is thicker than other conductive layers. Therefore, the intensity and radiation performance of the circuit substrate 400 can be improved.

The IDT and the terminal of the filter chip may be provided on the upper face of the filter chip, or may be provided on the lower face of the filter chip. The filter chip may be another acoustic wave filter chip other than the SAW filter chip such as a boundary acoustic wave filter chip or a FBAR filter chip. A duplexer chip in which a transmit filter and a receive filter are provided on a single chip may be provided inside of the laminate substrate 22. In this case, the active component 16a is provided so as to overlap with a projected region of the duplexer chip projected in the thickness direction of the laminate substrate 22. The first embodiment through the fourth embodiment may be applied to an example in which a filter other than the duplexer is provided inside of the laminate substrate 22.

A matching circuit for impedance matching may be provided between the duplexer 10 and the switch 12 of FIG. 1A, between the receive filter 10Rx and the RFIC 18 of FIG. 1A, and between the transmit filter 10Tx and the PA 16 of FIG. 1A. The matching circuit includes a chip component such as a capacitor and an inductor. It is preferable that the chip component is mounted on the upper face of the laminate substrate 22 so as to overlap with the projected region 10c or the projected region 10d. This is because an interconnection line can be shortened.

The present invention is not limited to the specifically described embodiments, but other embodiments and variations may be made without departing from the scope of the claimed invention.

What is claimed is:
1. A circuit substrate comprising:
a laminate substrate in which a conductive layer and an insulating layer are laminated;
an antenna terminal disposed in the laminate substrate;
a plurality of filter chips each having an acoustic wave filter and being provided inside of the laminate substrate, the plurality of filter chips including a transmit filter chip having a transmit filter and a receive filter chip having a receive filter, said transmit filter and said receive filter constituting a duplexer, and one of the filter chips being electrically connected to said antenna terminal; and an active component that is provided on a surface of the laminate substrate and is connected with said one of the filter chips, at least a part of the active component overlapping with a projected region that is a region of said one of the filter chips projected in a thickness direction of the laminate substrate.

2. The circuit substrate as claimed in claim 1, wherein whole of the active component is inside of the projected region.

3. The circuit substrate as claimed in claim 1, wherein said one of the filter chips is directly connected with the active component not through another component.

4. The circuit substrate as claimed in claim 1, wherein:
the transmit filter chip is connected between a transmit node and a common node;
the receive filter chip is connected between a receive node and the common node; and
the active component is connected with the transmit filter chip and overlaps with a projected region that is a region of the transmit filter chip projected in the thickness direction of the laminate substrate.

5. The circuit substrate as claimed in claim 1, wherein:
interconnection lines connecting said one of the filter chips and the active component includes a first interconnection line extending in a face direction of the laminate substrate and a second interconnection line extending in the thickness direction of the laminate substrate; and
the first interconnection line is shorter than the second interconnection line.

6. The circuit substrate as claimed in claim 1, wherein:
the laminate substrate includes a core made of a metal; and
each of the filter chips is provided inside of an opening formed in the core.

7. The circuit substrate as claimed in claim 1,
wherein said one of the filter chips is electrically connected to the antenna terminal via an interconnection line that extends in the thickness direction of the laminate substrate and a conductive layer that extends in the face direction, and
wherein the antenna terminal is disposed in a surface of the laminate substrate that is opposite to the surface on which the active component is provided.

* * * * *